United States Patent [19]

Peterson, Jr.

[11] Patent Number: 5,450,005
[45] Date of Patent: Sep. 12, 1995

[54] NET CHARGE MEASUREMENT OF DIELECTRICS IN GROUND POTENTIAL EQUILIBRIUM, AS A FUNCTION OF TIME AND TEMPERATURE

[76] Inventor: Thomas F. Peterson, Jr., 3060 Lander Rd., Pepper Pike, Ohio 44124

[21] Appl. No.: 95,395

[22] Filed: Jul. 21, 1993

[51] Int. Cl.⁶ .................................. G01R 31/02
[52] U.S. Cl. ................................ 324/72; 324/452; 324/457
[58] Field of Search ............... 324/445, 452, 453, 454, 324/457, 458, 72, 72.5

[56] References Cited

U.S. PATENT DOCUMENTS

| | | | |
|---|---|---|---|
| 2,820,947 | 1/1958 | Gunn | 324/72 |
| 2,931,221 | 4/1960 | Rusk | 73/179 |
| 3,189,802 | 6/1965 | Zisman | 361/289 |
| 3,292,059 | 12/1966 | Wood | 361/278 X |
| 3,344,344 | 9/1967 | Wales, Jr. | 324/458 |
| 3,579,054 | 5/1971 | Moulton | 361/434 |
| 4,101,825 | 7/1978 | Truax | 324/458 |
| 4,270,090 | 5/1981 | Williams | 324/457 |
| 4,820,990 | 4/1989 | Moore | 324/445 |
| 4,839,581 | 6/1989 | Peterson, Jr. | 324/72 |

FOREIGN PATENT DOCUMENTS

| | | | |
|---|---|---|---|
| 0416918 | 9/1990 | European Pat. Off. | H04N 7/13 |
| 0490538 | 11/1991 | European Pat. Off. | H04N 7/137 |

OTHER PUBLICATIONS

ICASSP '92, IEEE Int, Conf, on Acoustics, Speech and Signal Processing, vol. 3, 23 Mar. 1992, pp. 545–548.
P. Haskell et al. 'Resynchronization of Motion Compensated Video Affected by ATM Cell Loss', p. 545, 1992 IEEE.
"Keithley Low Level Measurements", 4th Edition, 1992 pp. 1-20-1-23; 4-38-4-41.
"Physics, vol. I Mechanics and Heat; vol. II Electricity, Magnetism and Optics", Reimann, 1971, pp. 514–515.
"Experimental Researches in Electricity", Faraday, Reprint of Philosophical Transactions of 1838–1843; Qrtly. J. of Sci. 1844, vol. II, pp. 280–285.
"The Dependence of Space Charge Spectra on Aitken Nucleus Concentrations", Anderson, Journ. of Geophysical Res. vol. 87, No. C2, pp. 1216–1218, Feb. 20, 1982.
"Electrostatic Measurement of Electrode Potentials", Ewell, Measurement of Electrode Potentials, The Physical Review, Am. Physical Society, vol. VI, Series II, pp. 271–282, 1915.
"Treatise on Electricity, in Theory and Practice", De la Rive, London: Longman, Brown, Green, & Longmans, 1853, pp. 62, 144–155.

Primary Examiner—Maura K. Regan
Assistant Examiner—Diep Do
Attorney, Agent, or Firm—Fay, Sharpe, Beall, Fagan, Minnich & McKee

[57] ABSTRACT

A motor assembly (A) cyclically moves a sample (34) longitudinally through the longitudinally aligned central bores (16, 18) of a pair of hollow electrodes (12, 14). One of the electrodes (14) is connected with a Faraday shield (10) which electrically shields the electrodes and the sample and the other electrode (12) is electrically insulated from the Faraday shield. Preferably, the Faraday shield structure further serves as a hermetic seal for sealing the hollow electrodes against adverse effects of the ambient atmosphere. An electrical instrument (C) is connected across the two hollow electrodes to measure the induced charge transfer or potential difference as the sample cyclically moves back and forth between the hollow bores of the two electrodes.

17 Claims, 4 Drawing Sheets

NET CHARGE MEASUREMENT OF DIELECTRICS IN GROUND POTENTIAL EQUILIBRIUM, AS A FUNCTION OF TIME AND TEMPERATURE

BACKGROUND OF THE INVENTION

The present invention relates to the art of electrical potential determination. It finds particular application in determining true or absolute potential and measuring other electrostatic potentials on an absolute scale. It is to be appreciated that the present invention is applicable to monitoring potential and change in potential relative to a standard or absolute potential reference. The potential of earth-ground or other objects, such as aircraft, fluid or grain containers, chemical reaction tanks, hospital patients, and the like may be measured.

Historically, voltage measuring devices required two different electrostatic potentials in order to produce a measurement. It has been considered a common convenience and practical convention for engineers and scientists to use the Earth as a common reference point when measuring single point sources of potential. Earth-ground is arbitrarily assigned a zero potential. A convenient common reference for voltage measurements is provided by a metal rod driven into the ground, a connection to a metallic water pipe, a connection to a power line common ground wire, or the like.

There are inherent inaccuracies resultant from measuring potential with reference to earth-ground. The potential of the Earth changes with time and location. Telluric currents flow along the Earth on both land and water. Telluric currents result from storms, time-varying electromagnetic induction, and other natural and man-made causes. Thus, the potential of earth-ground varies with location on the surface of the Earth and with time.

Further, solar wind and energetic charged particles, often associated with sunspots, periodically flow over and immerse the Earth. Exposure of the Earth to a varying flux of charged particles can also be expected to alter the absolute potential of the Earth.

Within the atmosphere, the Earth is more negative than the surrounding atmosphere, which surrounding atmosphere in turn has an altitude dependent potential difference relative to the Earth. That is, the potential difference across the atmosphere of the Earth is about 400,000 volts. The potential difference tends to vary most quickly adjacent the Earth with a voltage variation on the order of 75 to 250 volts per meter. Pollution, humidity, snow, rain, and other atmospheric events cause variations in this potential difference.

Electronic equipment in aircraft is commonly grounded to the metal frame of the airplane and other vehicles. However, aircraft with time assume a potential more closely related to the potential of the surrounding atmosphere than to the potential of the Earth below. The potential differences between aircraft tend to manifest themselves in operations such as mid-air refueling, in which two aircraft come into physical, hence electrical contact.

There are other, apparently much greater voltage or potential differences within thunderstorm clouds. From investigations of lightning and thunderstorms, it appears that some clouds can be hundreds of millions of volts different from other clouds or the ground.

By arbitrarily assigning a zero potential value to earth-ground, the possibility that the Earth can have a finite and changing potential is ignored. Like birds on a power line, measurements relative to earth-ground are completely unaware of large changes in Earth potential. With a standard reference, changes in the Earth potential with time and/or location, can be measured. With a reference potential, changes in Earth potential could be measured analogous to temperatures on the Celsius scale with "zero" at a readily measurable event, i.e. the freezing point of water. In time perhaps this electrical standard can be extrapolated to an absolute zero potential in the sense of absolute zero on the Kelvin temperature scale.

There are a variety of "full moon" type phenomenon which may be related to changes in the supposedly zero Earth potential. These effects include the build-up of boiler scale, the rate of polymerization of colloidal systems, and others which tend to vary with the 28 day cycle of the moon. Solar winds also vary on a 28 day cycle, mimicking the cycle of the moon. Other phenomenon such as bleeding during surgery, migraine onset, and neurological disorders follow similar cyclic patterns. Monitoring changes in the Earth potential may also alleviate recalibration and drift problems in electronic equipment, spontaneous explosions of potentially explosive materials, gremlins in the electronics of aircraft, submarines, space vehicles during launch, and the like. Other effects of Earth potential change may include blood clotting times, negative air ion benefits, crop and market cycles, reproduction rates of bacteria, and the like.

Lorrain and Corson have calculated that an Earth surface charge of $8.16 \times 10^{13}$ coulombs could generate the Earth's magnetic field. If one multiplies the charge density for a 0.9% sodium chloride solution observed using the present invention times a $1.664 \times 10^{24}$ grams estimate of the total quantity of water in the hydrosphere, one obtains an electrostatic charge of $6.3 \times 10^{13}$ coulombs, suggesting that the hydrosphere may well contain sufficient static charge to produce the Earth's magnetic field.

My earlier U.S. Pat. No. 4,839,581 issued Jun. 13, 1989 describes apparatus and techniques for measuring electrical potential. Although the apparatus described in the aforementioned patent was successful, it did have drawbacks, particularly in the area of long term drift when potential measurements were made repeatedly or intermittently over extended durations on the order of months and years. Another drawback with these prior apparatus is that their output readings were temperature dependent. The present application describes an apparatus and technique which enables an accurate determination of dielectric temperature coefficients which will provide a built-in temperature regulation.

Einstein's 1924 non-neutrality of matter hypothesis has been tested in the past, generally with equipment based on the Faraday "ice bucket" experiment. In the Faraday ice bucket experiment, an insulated pewter ice-pail was connected by a wire to a delicate gold-leaf electrometer. A round brass ball was hung from and insulated by a dry silk thread. The ice bucket and electrometer were perfectly discharged and the brass ball was charged when held some distance from the ice bucket. The brass ball was introduced into the volume of the ice bucket. When the brass ball had a positive charge, the electrometer diverged positively; when the brass ball was taken away, the electrometer collapsed perfectly. As the brass ball entered the ice bucket, the divergence of the electrometer increased until the brass ball was about 3 inches below the top edge of the ice pail. Thereafter, the divergence of the electrometer remained quite steady and unchanged for any greater depression into the ice pail. This was taken as showing that after this point, the inductive action of the brass ball is entirely exerted on the interior of the ice pail and not in any degree directly upon external objects. When the brass ball touched the bottom of the ice bucket, all of its charge was communicated to the ice pail; there is no longer any inductive action between the brass ball and the ice pail. Upon being withdrawn and examined, the brass ball was found to have been perfectly discharged.

Others have used Faraday cups to measure static charge. Keithley Instruments "Low Level Measurements" describes a test fixture for evaluating material for anti-static properties. A pair of conductive cups are mounted one inside the other separated by an insulator. A Model 617 electrometer is connected across the cups and set in the coulombs mode. An IC is placed in the tube and allowed to slide the length of the tube and fall into the Faraday cup. The amount of charge built up is registered by the electrometer. The test is typically repeated with the same IC and same length tubes of different materials. In this manner, different materials can be evaluated for anti-static protection.

The present invention contemplates a new and improved apparatus and measurement technique which overcomes the above-referenced problems and others.

SUMMARY OF THE INVENTION

In accordance with one aspect of the present invention, an apparatus is provided for measuring electrostatic charge. A pair of Faraday cups or hollow electrodes open at one end are mounted adjacent each other inside of a Faraday cage. Dielectric samples are mounted for movement between interior regions of the two Faraday cups. A means is provided for cyclically moving the dielectric samples back and forth between the two Faraday cups. An electrostatic measuring means is connected across the two Faraday cups for measuring induced charge transfer or relative potential therebetween during repeated cyclic motion of the sample.

In accordance with another aspect of the present invention, a means is provided for maintaining the Faraday cups at a constant temperature.

In accordance with another aspect of the present invention, the Faraday cups are hermetically sealed from the atmosphere.

In accordance with another aspect of the present invention, the measurement process is repeated with a plurality of different dielectric samples, each for a large multiplicity of cycles.

In accordance with another aspect of the present invention, a dielectric sample is moved cyclically back and forth between close, but not touching, physical proximity of a pair of electrodes which are shielded by a Faraday cage. Induced charge transfer between the two electrodes is measured in a large multiplicity of cycles.

In accordance with another aspect of the present invention, the measured charge transfer is recorded and changes in the measured charge transfer evaluated.

One advantage of the present invention is that it measures variations in earth-ground.

Another advantage of the present invention is that it enables potential to be measured relative to an absolute or reference standard.

Another advantage of the present invention is that it enables the potential of two or more objects or locations to be compared when the objects or locations are so far displaced that their relative potential cannot be readily measured by one instrument.

Yet another advantage of the present invention is that it enables correlations to be made between changes in the Earth's potential and phenomenon, processes, events, and the like which are influenced by such potential.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DESCRIPTION OF THE PREFERRED EMBODIMENT

Figure 1:
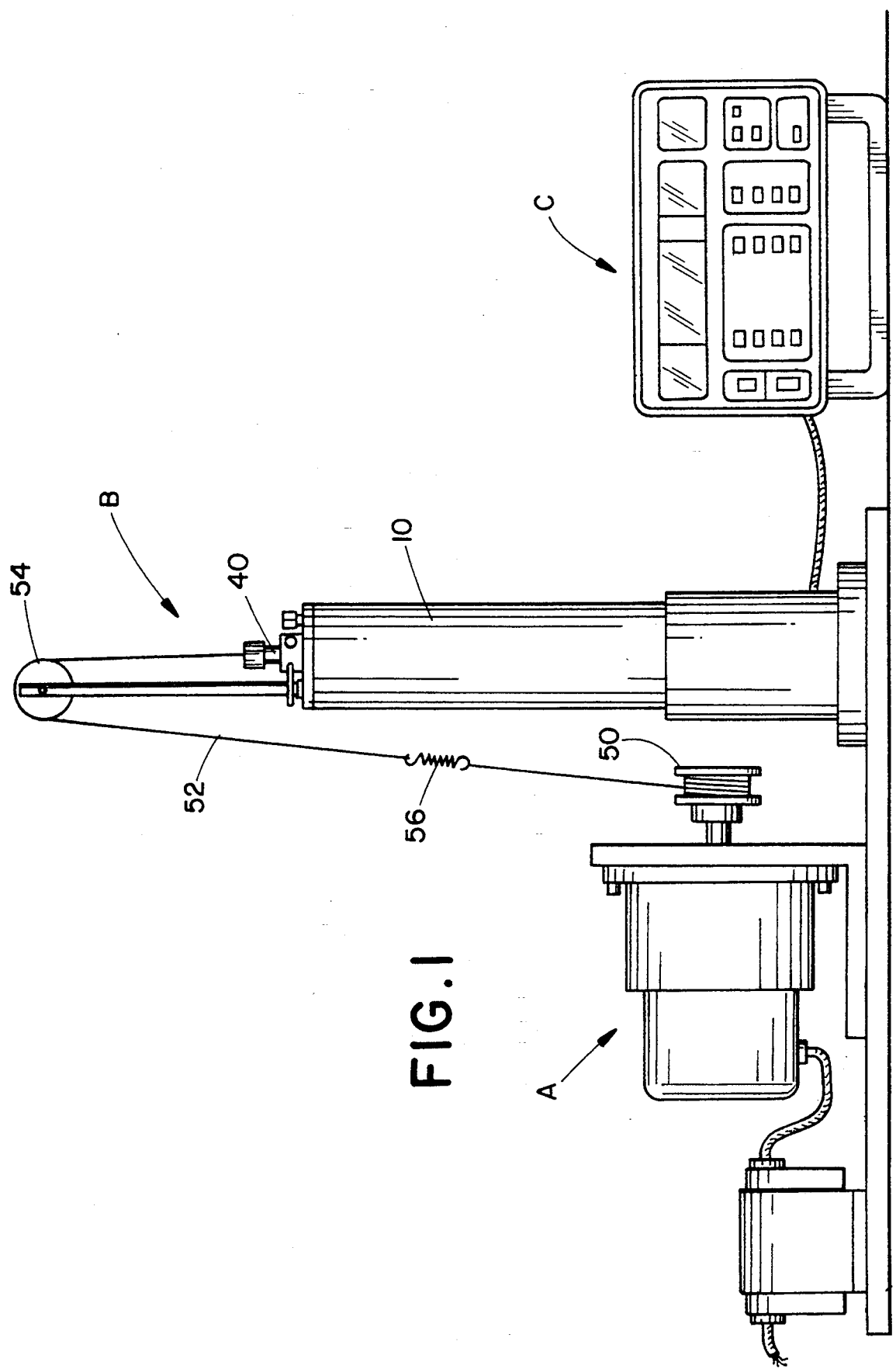
FIG. 1 is a front plan view of a potential measuring apparatus in accordance with the present invention.
Figure 2:
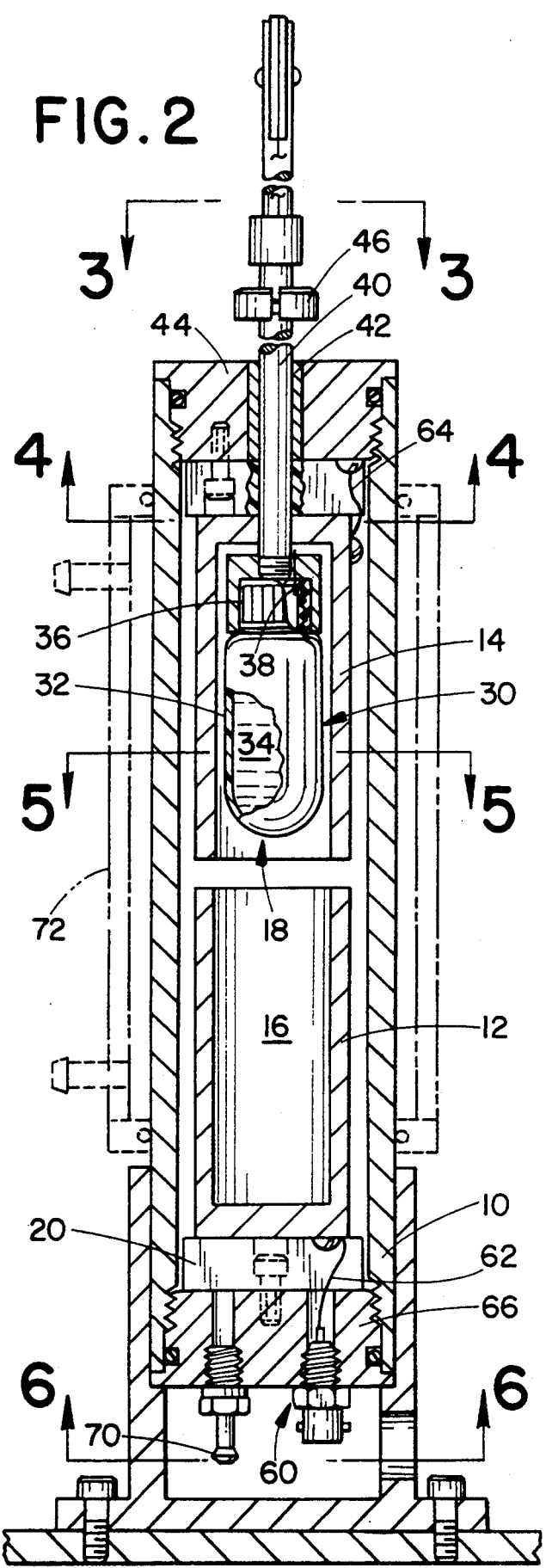
FIG. 2 is a side sectional view illustrating interior components of the Faraday cage component of FIG. 1.
Figure 3:
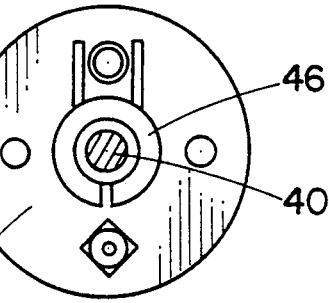
FIG. 3 is a sectional view through section 3—3 of FIG. 2.
Figure 4:
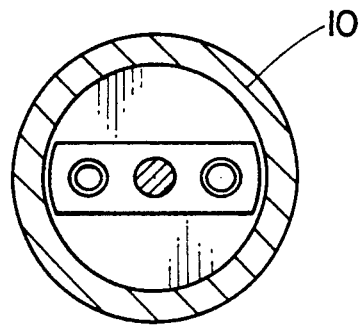
FIG. 4 is a sectional view through section 4—4 of FIG. 2.
Figure 5:
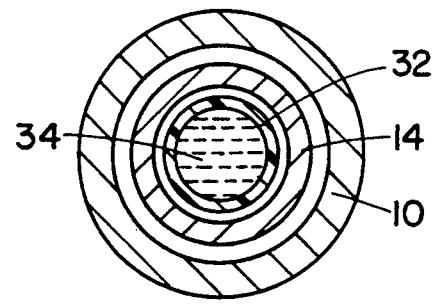
FIG. 5 is a sectional view through section 5—5 of FIG. 2.
Figure 6:
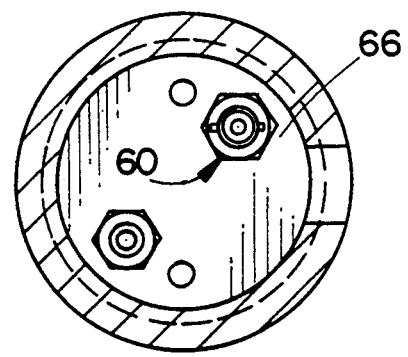
FIG. 6 is a sectional view through section 6—6 of FIG. 2.

With reference to FIG. 1, a reversing electric motor and motor controller assembly A functions as a means for cyclically moving samples within a Faraday cage assembly B with an electrostatic measuring means C, such as a Keithley Model 617 Electrometer.

With reference to FIGS. 2-6, the Faraday cage assembly B includes a Faraday cage 10 which provides shielding from electrical fields and gradients in the surrounding atmosphere. A pair of Faraday cup or hollow electrodes 12, 14 with one end open are mounted symmetrically within the Faraday shield. In the preferred embodiment, the Faraday cups or hollow electrodes surround circularly cylindrical inner bores 16, 18. The Faraday cups are supported with their central cylindrical bores 16, 18 in alignment. At least one of the Faraday cups 12 is supported on an insulator 20.

A sample 30 is mounted for reciprocal movement between the cylindrical bores of the two hollow electrodes 12, 14. More specifically to the preferred embodiment, the sample 30 includes a plastic or other electrically insulating vessel 32 which contains a dielectric material 34. In the preferred embodiment, the dielectric material is FC-77, a type of FLUORINERT TM perfluorinated liquid manufactured by 3M Corporation. The FC-77 FLUORINERT TM material is advantageous because it is chemically inert and stable. The FC-77 FLUORINERT TM material protects the surface of the grounding electrode within the sample bottle to prevent polarization or contamination. The thermal and electron conductivities of the FC-77 FLUORINERT ™ material are sufficient to allow ground potential and temperature changes to achieve charge density equilibrium within reasonable periods of time. Other suitable materials include saline solution, methanol, glycerol, water, and the like. Because glycerol readily absorbs water, the ratio of water and glycerol in a mixture can be adjusted to create a liquid with a susceptibility of anywhere between 40 and 80.

A nonconductive closure 36 seals the vessel against evaporation. To assure electrical communication between the dielectric material 34 and the Faraday cage 10, a sharp pointed 38 preferably extends through the closure 36 into the sample material 34. A conductive slide rod 40 is mounted for sliding movement along a guide surface 42 of a top conductive cap or plug 44. Rather than using the electrode, slide rod, and plug to define a conductive path from the material 34 to the Faraday cage, a wire can extend through a hollow bore in the slide rod. Stop 46 and the closure 36 limit sliding movement of the support rod, hence the sample, such that the sample is movable reciprocally within the hollow electrodes without physically touching the insulated electrode 12.

The motor and control assembly A includes a spool or bobbin 50 from which a string 52 extends over a pulley 54 and is connected with the slide rod 40. A spring 56 provides resiliency to provide the motor assembly leeway between the stops reaching the limit position and the motor assembly reversing. Preferably, the controller continuously operates the motor in the reversing mode such that the sample moves cyclically back and forth between the interior wells of hollow electrodes 12 and 14.

The electrometer C is connected with the two hollow electrodes. More specifically to the preferred embodiment, a coaxial connector 60 has a central connection connected by an electrical conductor 62 with the insulated hollow electrode 12. An outer conductor of the coaxial electrical socket is connected with the Faraday cage 10 and the hollow electrode 14. More specifically to the preferred embodiment, the hollow electrode 14 is connected by a connector 64 with the threaded top element or plug 44 of the Faraday cage. The plug 44 is connected with the outer Faraday cage cylinder 10 which, in turn, is connected with a second electrically conductive end fitting 66 of the Faraday cage assembly. The coaxial fitting 60 is connected with the lower fitting 66 to provide electrical communication between the outer coaxial socket and the Faraday cage, hence the electrode 14.

Further to the preferred embodiment, the Faraday cage 10 is a complete cylinder into which the end plugs 44 and 66 are threadedly received in a fluid tight seal. In this manner, the Faraday cage is also hermetically sealed. The hermetic seal prevents atmosphere within the Faraday cage from changing humidity, prevents insects or contaminants from entering the Faraday cage or hollow electrodes, and the like. A fitting 70 is provided for selectively controlling the atmosphere within the Faraday cage. The check valve fitting 70 may be connected with sources of known, dry gas to fill the Faraday cage with a known gaseous atmosphere.

Optionally, a water jacket 72 is provided around the Faraday cage. The water jacket has ports which are interconnectable with a pump for circulating water or other fluid which is maintained at a controlled temperature through the water jacket. In this manner, the instrument can be maintained at a preselected, constant temperature.

The resistance of air or other gas between the electrode and the Faraday shield is measured as well as the capacitance of the Faraday cage assembly B to assure that the charge measured is due entirely to the sample and not to off-set voltage or capacitance effects.

Figure 7:
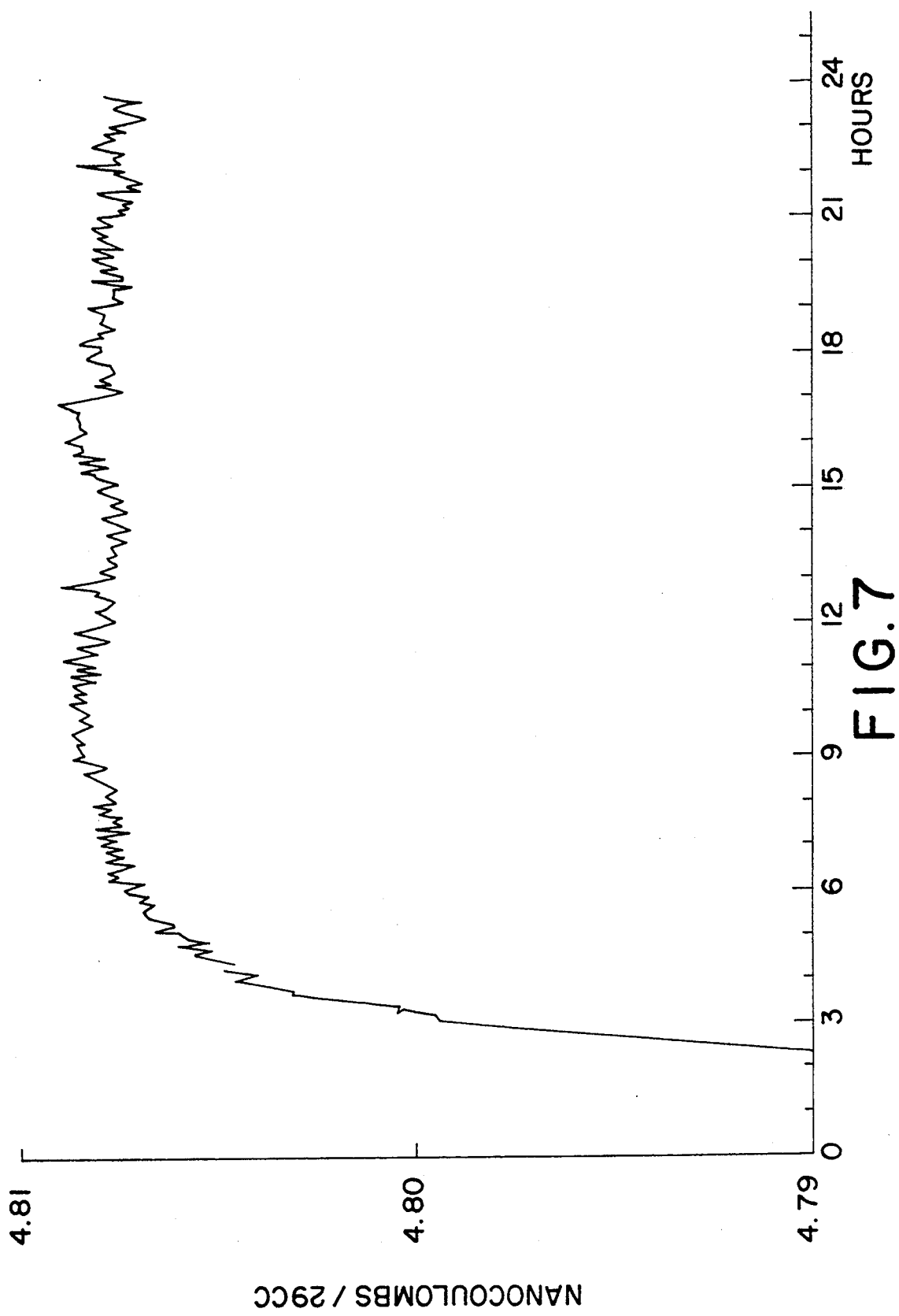
FIG. 7 is an exemplary plot of net charge density (nanocoulombs/29 cc) versus time (hours) for glycerol.

With reference to FIG. 7, the net charge of a recently "activated" or put into service sample material 34 is observed to approach a steady state value asymptotically. Instead of decaying to zero, each of the samples becomes stable at a characteristic non-zero charge value, regardless whether it requires hours, days, or months to achieve this equilibrium charge level. If samples are removed from the Faraday cage assembly and charged to a higher negative or positive charge level, with repeated cyclings they each return to the same characteristic charge value.

Figure 8:
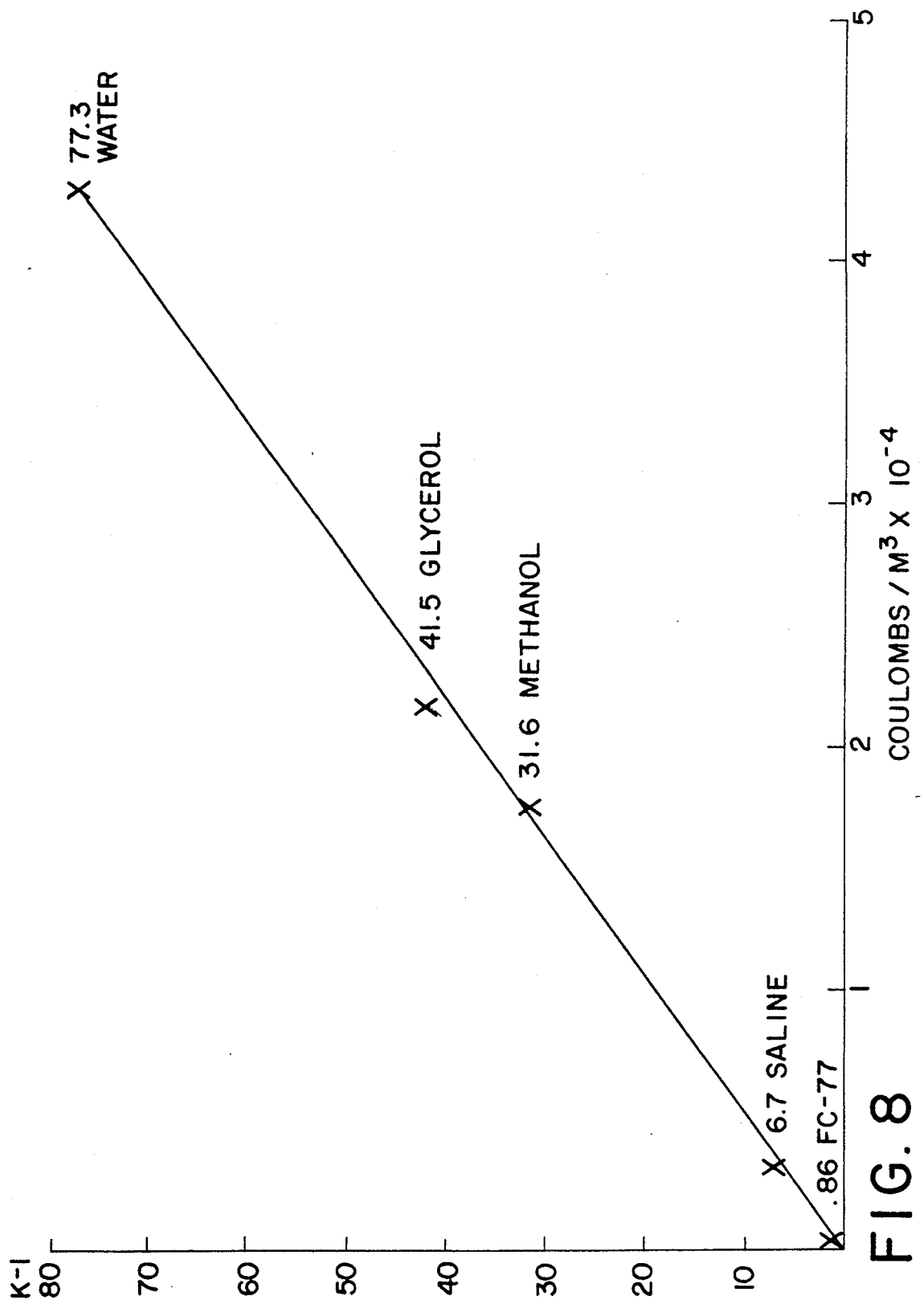
FIG. 8 is an exemplary plot of dielectric net charge at ground potential versus dielectric coefficient, particularly susceptibility, for various dielectric materials.

With reference to FIG. 8, the characteristic charge value of each sample is observed to be related linearly to the dielectric susceptibility ($\epsilon_r - 1$) or ($k - 1$) of the sample material 34. As stated by Maxwell, the concentration of charge is equivalent to the concentration of potential. Because the apparent characteristic charge density of dielectrics is at equilibrium with the surrounding and grounded metal Faraday shield, one might assume that the shield has a potential value other than the zero which is assigned by convention to earth-ground. Stable net charge must be trapped or bound by some undetermined mechanism or else it would dissipate under coulomb forces according to Poisson's Equation.

The slope illustrated in FIG. 8 can be characterized as:

$$\Phi_0 = (Q_d/\text{volume})/(\epsilon_0 (\epsilon_r - 1)) \qquad (1),$$

where $\Phi_0$ in volts designates an absolute reference ground potential as distinguished from the arbitrary zero convention; $Q_d$ is a net dielectric charge which is detected as a consequence of the electrostatic potential at the surface of the Earth; $\epsilon_0$ is a reference or vacuum permittivity; and $\epsilon_r$ is relative permittivity of the dielectric sample. A non-zero earth-ground potential $\Phi_0$ polarizes molecules by increasing their electrostatic potential energy without violating the charge conservation principle. An electrostatic energy $U_d$ absorbed as a function of $\Phi_0$ is equivalent to charge binding energy as defined by:

$$U_d = \Phi_0 Q_d \qquad (2).$$

In an example when the measured dielectric net charge $Q_d = 0$, then $U_d = 0$. Under this condition, $\Phi_0$ is defined as zero. With the above calculated scale, the data indicates that the Earth surface absolute potential is about 500,000 volts negative. Dielectric samples measured with the apparatus indicate a temperature dependence of charge density. The charge varies in accordance with the expected sample permittivity change due to temperature. The charge density of the FC-77 FLUORINERT ™ material is reduced by about 3% for each degree centigrade increase at about 25° C. When the temperature is returned to an initial value, the charge density returns to the initial value. Water, by distinction, exhibits about a 0.5% increase in charge for each degree centigrade of temperature decrease.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. An apparatus for measuring electrostatic potential, the apparatus comprising:
   a Faraday cage;
   a first hollow electrode having an opening adjacent one end, the first hollow electrode being mounted in the Faraday cage and electrically insulated therefrom;
   a second hollow electrode mounted in the Faraday cage, the second electrode having an opening in alignment with the opening of the first hollow electrode;
   a self-contained dielectric material movably mounted in the Faraday cage for movement between interiors of the first and second hollow electrodes;
   means for cyclically moving the self-contained dielectric material as a whole repeatedly between the interiors of the two electrodes.

2. The apparatus as set forth in claim 1 further including an electrical measuring means, the electrical measuring means being connected in electrical interconnection with the first and second electrodes for measuring one of a relative potential and an induced charge flow therebetween.

3. The apparatus as set forth in claim 2 wherein the second hollow electrode is electrically connected with the Faraday cage.

4. The apparatus as set forth in claim 3 further including a means for hermetically sealing the first and second hollow electrodes and the self-contained dielectric material from ambient air.

5. The apparatus as set forth in claim 3 wherein the self-contained dielectric material includes:
   a dielectric fluid sealed within a hollow, insulating vessel.

6. An apparatus for measuring electrostatic potential, the apparatus comprising:
   a Faraday cage;
   a first hollow electrode having an opening adjacent one end, the first hollow electrode being mounted in the Faraday cage and electrically insulated therefrom;
   a second hollow electrode having an opening adjacent one end, the second hollow electrode being mounted in and electrically connected with the Faraday cage;
   a hollow, insulating vessel;
   a dielectric material sealed within the hollow, insulating vessel;
   means for cyclically moving the hollow, insulating vessel between interiors of the first and second hollow electrodes;
   a means for electrically connecting the dielectric material cyclically with the Faraday cage;
   an electrical measurement circuit connected with the first and second electrodes to measure one of a relative potential and an induced charge flow therebetween.

7. The apparatus as set forth in claim 3 further including a temperature control means for maintaining the first and second hollow electrodes and the sample at a constant temperature.

8. The apparatus as set forth in claim 3 wherein the first and second hollow electrodes define cylindrical bores therein, the first and second electrodes being mounted with the first and second bores in longitudinal alignment such that the sample is movable longitudinally through the bores in a physically displaced relationship to the first and second electrodes, the first and second bores each having a depth of larger dimension than a longitudinal dimension of the sample.

9. The apparatus as set forth in claim 3 wherein the first and second electrodes have longitudinal bores therein, the first and second electrodes being arranged with the longitudinal bores in alignment with each other, the first and second electrodes being symmetric relative to a plane transverse to the longitudinal axis midway therebetween, 10. A method of measuring electrical potential, the method comprising:
   (a) cyclically and repeatedly moving a same dielectric sample as a whole back and forth between hollow, longitudinally aligned bores of at least a pair of hollow electrodes, the electrodes being shielded by a Faraday shield;
   (b) measuring one of charge transfer and electrical potential between the hollow electrodes as the same single dielectric sample cyclically and repeatedly moves between the hollow bores of the electrodes.

11. The method as set forth in claim 10 wherein the moving step (a) is repeated cyclically over a multitude of cycles and the measuring step (b) is repeated in each cycle.

12. The method as set forth in claim 10 wherein the sample is maintained in a spaced relationship to the electrodes during the moving step (a).

13. The method as set forth in claim 10 wherein the sample includes at least one of: an inert fluorocarbon material, glycerol, distilled water, a water solution, plastics, wood, rubber, and ceramic.

14. The method as set forth in claim 10 wherein the sample includes one of a powder and a liquid sealed in a dielectric container.

15. The method as set forth in claim 10 wherein one of the electrodes is electrically connected with the Faraday shield and the other electrode is electrically insulated from the Faraday shield.

16. The method as set forth in claim 11 wherein the moving and measuring steps are cyclically repeated until the measured potential reaches a steady state potential.

17. An apparatus for measuring electrostatic potential, the apparatus comprising:
   a Faraday cage;
   a first hollow electrode having an opening adjacent one end, the first hollow electrode being mounted in the Faraday cage and electrically insulated therefrom;
   a second hollow electrode having an opening adjacent one end, the second electrode being mounted in and electrically connected with the Faraday cage;

a solid dielectric sample movably mounted in the Faraday cage for repeating cyclic movement between interior of the first and second hollow electrodes;

an electrical measuring circuit, the electrical measuring circuit being connected in electrical interconnection with the first and second hollow electrodes for measuring one of a relative potential and an induced charge flow therebetween.

* * * * *

UNITED STATES PATENT AND TRADEMARK OFFICE
CERTIFICATE OF CORRECTION

PATENT NO. : 5,450,005
DATED : September 12, 1995
INVENTOR(S) : Peterson, Jr.

It is certified that error appears in the above-indentified patent and that said Letters Patent is hereby corrected as shown below:

On the cover page, in the section under "References Cited", please delete:

FOREIGN PATENT DOCUMENTS

0416918  9/1990  European Pat. Off.  ..... H04N 7/13
0490538  11/1991 European Pat. Off.  .... H04N 7/137 and, under "OTHER PUBLICATIONS", please delete:

ICASSP '92, IEEE Int, Conf, on Acoustics, Speech and Signal Processing, vol. 3, 23, Mar. 1992, pp. 545-548

P. Haskell et al. 'Resynchronization of Motion Compensated Video Affected by ATM Cell Loss', p. 545, 1992 IEEE.

UNITED STATES PATENT AND TRADEMARK OFFICE
CERTIFICATE OF CORRECTION

PATENT NO. : 5,450,005
DATED : September 12, 1995
INVENTOR(S) : Thomas F. Peterson, Jr.

It is certified that error appears in the above-indentified patent and that said Letters Patent is hereby corrected as shown below:

In column 6, line 39, Equation (1) should read:

$$\Phi_0 = (Q_d/\text{volume})/(\epsilon_0(\epsilon_r - 1))$$

Signed and Sealed this

Twenty-third Day of January, 1996

Attest:

BRUCE LEHMAN

Attesting Officer     Commissioner of Patents and Trademarks